(12) United States Patent
Guo et al.

(10) Patent No.: US 11,862,385 B2
(45) Date of Patent: Jan. 2, 2024

(54) ELECTRONIC DEVICE, CONNECTOR, AND ELECTROMAGNETIC DEVICE THEREOF

(71) Applicant: SHENNAN CIRCUITS CO., LTD., Shenzhen (CN)

(72) Inventors: Weijing Guo, Shenzhen (CN); Yuhua Zeng, Shenzhen (CN); Hua Miao, Shenzhen (CN); James Quilici, Shenzhen (CN)

(73) Assignee: SHENNAN CIRCUITS CO., LTD., Shenzhen (CN)

( * ) Notice: Subject to any disclaimer, the term of this patent is extended or adjusted under 35 U.S.C. 154(b) by 607 days.

(21) Appl. No.: 17/090,920

(22) Filed: Nov. 6, 2020

(65) Prior Publication Data

US 2021/0057145 A1 Feb. 25, 2021

Related U.S. Application Data

(63) Continuation of application No. PCT/CN2018/094350, filed on Jul. 3, 2018.

(51) Int. Cl.
*H01F 27/29* (2006.01)
*H01F 27/06* (2006.01)
(Continued)

(52) U.S. Cl.
CPC .............. *H01F 27/29* (2013.01); *H01F 27/06* (2013.01); *H01F 27/2804* (2013.01);
(Continued)

(58) Field of Classification Search
CPC ...... H01F 27/29; H01F 27/06; H01F 27/2804; H01F 2027/065; H01F 2027/2814;
(Continued)

(56) References Cited

U.S. PATENT DOCUMENTS

2010/0013589 A1* 1/2010 Schaffer ................ H01F 41/046
336/200
2013/0323974 A1* 12/2013 Gutierrez ............... H01R 43/00
336/200

FOREIGN PATENT DOCUMENTS

CN 102956350 A 3/2013
CN 205609340 U 9/2016
(Continued)

OTHER PUBLICATIONS

International search report,Application No. PCT/CN2018/094350, dated Mar. 26, 2019 (6 pages).

*Primary Examiner* — Tuyen T Nguyen

(57) ABSTRACT

An electromagnetic device includes a substrate, magnetic cores, transmission line layers, and conductive members. The substrate is provided with annular receiving grooves for accommodating the magnetic cores; the substrate is divided into a central portion and a peripheral portion; inner and outer via holes are respectively formed on the central portion and the peripheral portion, respectively; the transmission line layers each including wire patterns are respectively provided on opposite sides of the substrate; and the conductive members are sequentially connected to the wire patterns on both sides of the substrate to form a transformer and/or a filter; the electromagnetic device has a first side provided with a slot and a second side parallel to the transmission line layers; and first conductive pins electrically connected to the at least one transmission line layers are provided on at least one of the side wall surrounding the slot and a second side.

20 Claims, 8 Drawing Sheets

(51) Int. Cl.
    *H01F 27/28*     (2006.01)
    *H01R 12/57*     (2011.01)
    *H03H 1/00*     (2006.01)
    *H05K 1/18*     (2006.01)
    *H01R 24/64*     (2011.01)

(52) U.S. Cl.
    CPC ........... *H01R 12/57* (2013.01); *H03H 1/0007* (2013.01); *H05K 1/181* (2013.01); *H01F 2027/065* (2013.01); *H01F 2027/2814* (2013.01); *H01R 24/64* (2013.01); *H03H 2001/0092* (2013.01); *H05K 2201/1006* (2013.01); *H05K 2201/10522* (2013.01)

(58) Field of Classification Search
    CPC .... H01F 27/2895; H01F 17/06; H01F 17/062; H01R 12/57; H01R 24/64; H01R 13/6658; H03H 1/0007; H03H 2001/0092; H03H 7/0115; H05K 1/181; H05K 2201/1006; H05K 2201/10522
    See application file for complete search history.

(56) References Cited

FOREIGN PATENT DOCUMENTS

| | | |
|---|---|---|
| JP | 2016015453 A | 1/2016 |
| JP | 2016039222 A | 3/2016 |

\* cited by examiner

ELECTRONIC DEVICE, CONNECTOR, AND ELECTROMAGNETIC DEVICE THEREOF

CROSS-REFERENCE TO RELATED APPLICATIONS

The present disclosure is a continuation-application of International (PCT) Patent Application No. PCT/CN2018/094350 filed on Jul. 3, 2018, the entire contents of which are hereby incorporated by reference in their entireties.

TECHNICAL FIELD

The present disclosure relates to the technical field of integrated circuits, and in particular, to an electronic device, a connector, and an electromagnetic device thereof.

BACKGROUND

A connector is a component used to realize electrical connection between two different devices, playing the role of a switch and a bridge. As a signal transmission medium, it has become an indispensable component in modern equipment. A connector at least includes an electromagnetic device and a connector assembly which are electrically connected. The electromagnetic device is used to perform signal processing (for example, perform transforming and/or filtering processing) for signals transmitted between two devices. The connector assembly is used to adapt to an interface of one of the devices. Among them, the shape and arrangement of the conductive pins of the connector assembly need to match the shape and arrangement of the external terminals of the interface, so as to facilitate the electrical connection between the connector assembly and the interface. However, the connector assembly is connected to the surface of the electromagnetic device by means of welding, the connection is unstable, and is prone to cause failure of the connection between the connector assembly and the electromagnetic device, thereby affecting use.

SUMMARY OF THE DISCLOSURE

The present disclosure provides an electronic device, a connector, and an electromagnetic device thereof, so as to solve the technical problem in the prior art that connection between a connector assembly and an electromagnet device in a connector is unstable.

In order to solve the above technical field, one technical solution adopted by the present disclosure is to provide an electromagnetic device comprising: a substrate defining a plurality of annular receiving grooves, wherein each annular receiving groove divides the substrate into a central portion surrounded by the annular receiving groove and a peripheral portion surrounding the annular receiving groove, each central portion defines a plurality of inner via holes running through the substrate, and each peripheral portion defines a plurality of outer via holes running through the substrate; a plurality of magnetic cores each received in a corresponding one of the plurality of annular receiving grooves; at least two transmission line layers, wherein each of two opposite sides of the substrate is provided with one of the transmission line layers, each transmission line layer comprises a plurality of wire patterns arranged spacedly, and each wire pattern is bridged between one of the inner via holes and one of the outer via holes corresponding to each other; a plurality of conductive members, which are respectively disposed in each of the inner via holes and each of the outer via holes, and are configured to sequentially connect the wire patterns on the two transmission line layers so as to form a coil circuit capable of surrounding the magnet cores; wherein, the plurality of central portions on the substrate, the peripheral portions corresponding thereto, the plurality of magnet cores, the plurality of conductive members, and the transmission line layers located at the two opposite sides of the substrate form a plurality of transformers and/or a plurality of filters; wherein, the electromagnetic device further comprises a first side surface being perpendicular to the transmission line layers, the first side surface is provided with an insertion slot, the insertion slot runs through the electromagnetic device along an axial direction of one of the inner via holes, and the insertion slot is configured to fix and connect the first adapter plate.

In order to solve the above technical problem, another technical solution adopted by the present disclosure is to provide a connector comprising a first adapter plate, at least one connector assembly, and at least one electromagnetic device as described above; wherein, one end of the first adapter plate is inserted in the insertion slot of the at least one electromagnetic device, and is electrically connected with the at least one electromagnetic device; another end of the first adapter plate extends out of the insertion slot and is fixed to and connected with the at least one connector assembly; the at least one electromagnetic device is electrically connected with the at least one connector assembly through the first adapter plate.

In order to solve the above technical problem, another technical solution adopted by the present disclosure is to provide an electronic device, the electronic device comprises a mother board and at least one connector as described above; the mother board is provided with an external circuit, and the external circuit is electrically connected with the at least one connector.

Advantageous effect of the above embodiments are that: the first side surface of the electromagnetic device being perpendicular to the transmission line layers is provided with the insertion slot, which is used to fix and connect the first adapter plate; the connection component is fixed on the first adapter plate and is connected with the electromagnetic device through the first adapter plate. The insertion slot makes both two sides of the first adapter plate be subjected to uniform forces, so that the connection between the first adapter plate and the electromagnetic device is more stable; the connector assembly is fixed on the first adapter plate, so that the connection between the connector assembly and the electromagnetic device is more stable.

BRIEF DESCRIPTION OF THE DRAWINGS

In order to describe technical solutions in embodiments of the present disclosure or in the prior art more clearly, drawings required being used in description of the embodiments or the prior art will be simply introduced below. Obviously, the drawings in the following description are merely some embodiments of the present disclosure. For one of ordinary skill in the art, it is also possible to obtain other drawings according to these drawings without paying any creative work.

DETAILED DESCRIPTION

Figure 1:
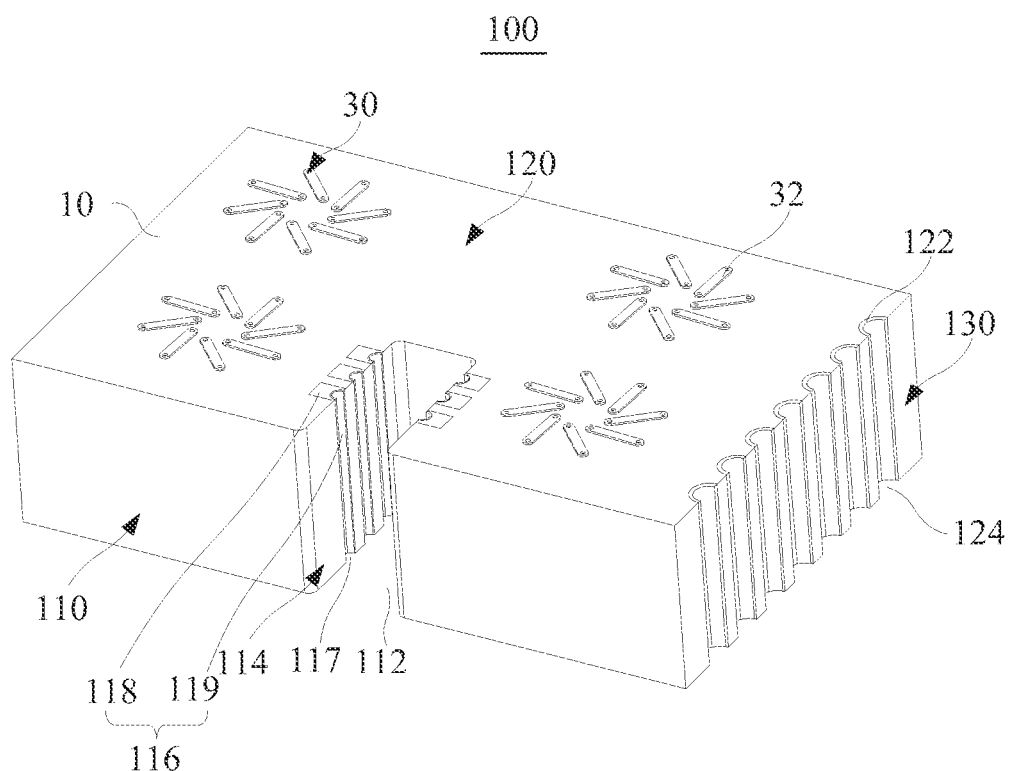
FIG. 1 is a stereoscopic structural view of an electromagnetic device in one embodiment of the present disclosure.

Technical solutions of embodiments of the present disclosure will be clearly and completely described below. Obviously, the described embodiments are merely some embodiments, but not all embodiments of the present disclosure. Based on the embodiments of the present disclosure, all of the other embodiments obtained by one of ordinary skill in the art without making any creative work belong to the protection scope of the present disclosure.

According to a first aspect of the present disclosure, an electromagnetic device is provided, wherein the electromagnetic device comprises: a substrate defining a plurality of annular receiving grooves, wherein each annular receiving groove divides the substrate into a central portion surrounded by the annular receiving groove and a peripheral portion surrounding the annular receiving groove, each central portion defines a plurality of inner via holes running through the substrate, and each peripheral portion defines a plurality of outer via holes running through the substrate; a plurality of magnetic cores each received in a corresponding one of the plurality of annular receiving grooves; at least two transmission line layers, wherein each of two opposite sides of the substrate is provided with one of the transmission line layers, each transmission line layer comprises a plurality of wire patterns arranged spacedly, and each wire pattern is bridged between one of the inner via holes and one of the outer via holes corresponding to each other; and a plurality of conductive members, which are respectively disposed in each of the inner via holes and each of the outer via holes, and are configured to sequentially connect the wire patterns on the two transmission line layers so as to form a coil circuit capable of surrounding the magnet cores; wherein, the plurality of central portions on the substrate, the peripheral portions corresponding thereto, the plurality of magnet cores, the plurality of conductive members, and the transmission line layers located at the two opposite sides of the substrate form a plurality of transformers and/or a plurality of filters; wherein, the electromagnetic device further comprises a first side surface being perpendicular to the transmission line layers, the first side surface is provided with an insertion slot, the insertion slot runs through the electromagnetic device along an axial direction of one of the inner via holes, and the insertion slot is configured to fix and connect the first adapter plate.

In some embodiments, the electromagnetic device further comprises a second side surface and a first conductive pin, the second side surface is parallel to the transmission line layers; the first conductive pin is disposed on at least one of a side wall of the electromagnetic device surrounding the insertion slot and the second side surface, and the first conductive pin is electrically connected with at least one of the transmission line layers.

In some embodiments, the first conductive pin is disposed on the second surface or disposed on both the side wall and the second surface, and extends to a junction between the second side surface and the side wall.

According to a second aspect of the present disclosure, a connector is provided, wherein the connector comprises a first adapter plate, at least one connector assembly, and at least one electromagnetic device according to the first aspect of the present disclosure; wherein, one end of the first adapter plate is inserted in the insertion slot of the at least one electromagnetic device, and is electrically connected with the at least one electromagnetic device; another end of the first adapter plate extends out of the insertion slot and is fixed to and connected with the at least one connector assembly; the at least one electromagnetic device is electrically connected with the at least one connector assembly through the first adapter plate.

In some embodiments, the first adapter plate and the connector assembly are an integrated structure.

In some embodiments, the insertion slot is provided therein with a connection layer, and the connection layer is sandwiched between the first adapter plate and the side wall of the insertion slot.

In some embodiments, the connector assembly comprises a casing and a first conductive joint; the first conductive joint includes a first conductive connecting portion and a second conductive connecting portion, the second conductive connecting portion is disposed in the casing, and the second conductive connecting portion has one end electrically connected with the first adapter plate and another end electrically connected with the first conductive connecting portion; the first conductive connecting portion extends out of the casing, and an included angle between the first conductive connecting portion and the second conductive connecting portion is less than 90°.

In some embodiments, the connector comprises at least two electromagnetic devices, the at least two electromagnetic devices are arranged to be stacked along an axial direction of the inner via hole, and the insertion slots of the at least two electromagnetic devices are aligned with each other.

In some embodiments, the connector comprises at least two connector assemblies; one end of the first adapter plate is inserted in the at least two insertion slots, an end of the first adapter plate extending out of the insertion slot is sandwiched between the two connection assemblies, and the two connector assemblies are respectively fixed to and electrically connected with the first adapter plate.

In some embodiments, both two opposite surfaces of the first adapter plate being in contact with each connector assembly are provided with a first pad and a second pad, the first pad is electrically connected with the second pad; wherein, the first pad is located out of the insertion slot, and the second pad is located in the insertion slot; the first pad is welded with a corresponding second conductive connecting portion, and the second pad is welded with a corresponding first conductive pin, so that the second conductive connecting portion is electrically connected with a corresponding first conductive pin.

In some embodiments, the connector further comprises a second adapter plate, the at least two electromagnetic devices are fixed on the second adapter plate, and are electrically connected with the second adapter plate.

In some embodiments, wherein, the second conductive connecting portion of each connector assembly is parallel to the second adapter plate.

In some embodiments, the electromagnetic device further comprises a third side surface being perpendicular to the transmission line layer, the third side surface is disposed adjacently to the first side surface; the third side surface is provided thereon with a second conductive pin, and the second conductive pin is electrically connected with at least one transmission line layer; the second adapter plate is provided with a third pad, the third pad is welded with the second conductive pin, so that the electromagnetic device is fixed on the second adapter plate.

In some embodiments, both the first conductive pin and the second conductive pin run through the electromagnetic device, and a clearance is provided between every two adjacent electromagnetic devices, so that two corresponding first conductive pins or two corresponding second conductive pins on the two adjacent electromagnetic devices are insulated from each other.

In some embodiments, the connector further comprises an insulating layer, the insulating layer is sandwiched between every two adjacent electromagnetic devices.

In some embodiments, a sum of lengths of the first conductive pin and the second conductive pin of adjacent electromagnetic devices is less than a thickness of the electromagnetic device.

In some embodiments, a surface of the second adapter plate being away from the third pad is provided with a conductive needle, the conductive needle is electrically connected with the third pad, and the conductive needle is configured to electrically connect the connector with an external circuit.

In some embodiments, at least one side of the connector having the transmission line layer is provided with a joint layer configured to fix and electrically connect an electronic device; the joint layer is located in the same layer as, not overlapped with, and electrically connected with the transmission line layer at the side.

In some embodiments, the connector further comprises a composite layer disposed on at least one side of the connector having the transmission line layer, and configured to dispose the electronic component so that the electronic component is electrically connected with at least one transmission line layer; the composite layer includes a connection layer and a conductive layer, the connection layer is located between the conductive layer and a corresponding transmission line layer, and the electronic component is attached on the conductive layer.

According to a third aspect of the present disclosure, an electronic device is provided, wherein the electronic device comprises a mother board and at least one connector according to the second aspect of the present disclosure; wherein the mother board is provided with an external circuit, and the external circuit is electrically connected with the at least one connector.

Figure 2:
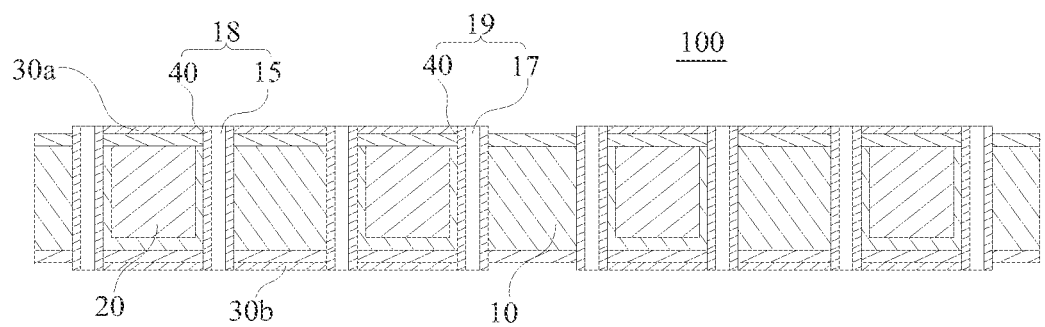
FIG. 2 is a cross-sectional structural schematic view of the electromagnetic device in FIG. 1.

In one aspect, the present disclosure provides an electromagnetic device 100. As shown in FIG. 1 and FIG. 2, in this embodiment, the electromagnetic device 100 can mainly comprise: a substrate 10, a plurality of magnetic cores 20 embedded in the substrate 10, two transmission line layers 30 located at two opposite sides of the substrate 10, and a plurality of conductive members 40.

Figure 3:
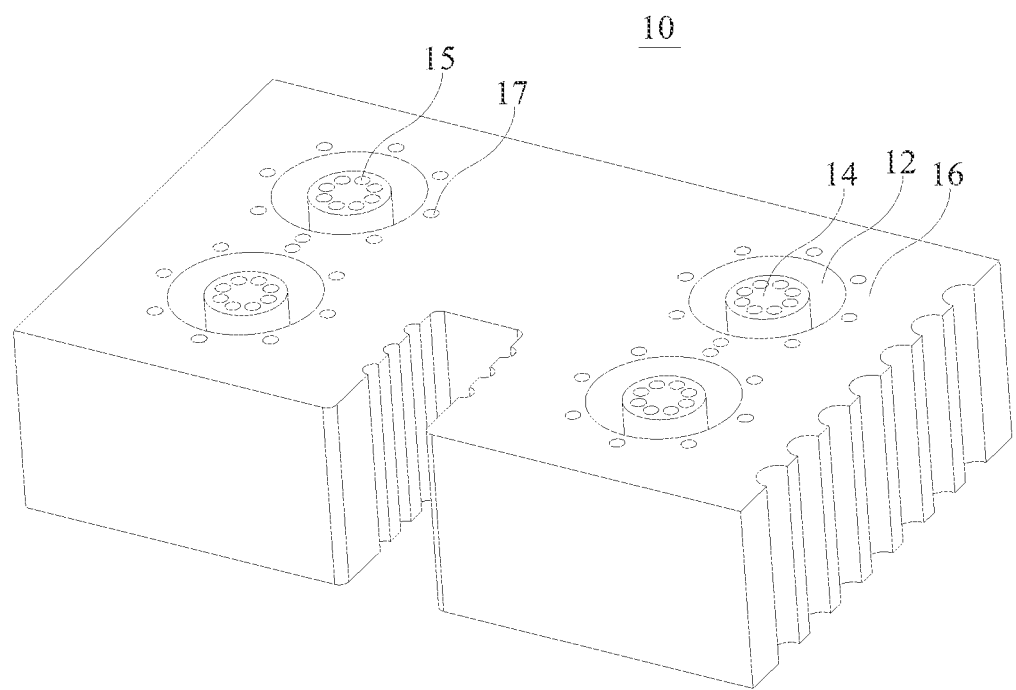
FIG. 3 is a stereoscopic structural view of a substrate in FIG. 1.

Wherein, referring to FIG. 3, in this embodiment, the substrate 10 is provided thereon with a plurality of annular receiving grooves 12, each annular receiving groove 12 divides the substrate 10 into a central portion 14 surrounded by the annular receiving groove 12 and a peripheral portion 16 corresponding to the central portion 14. In this embodiment, as shown in FIG. 3, the substrate is provided thereon with four annular receiving grooves 12, such that the substrate 10 is divided into four central portions 14 and four peripheral portions 16; wherein, the central portions 14 are in one-to-one correspondence with the peripheral portions 16.

In this embodiment, the central portion 14 and the peripheral portion 16 can be an integrated structure, that is, by defining the annular receiving groove 12 at a center of the substrate 10, the substrate 10 is divided into the central portion 14 and the peripheral portion 16. Of course, in other embodiments, the central portion 14 and the peripheral portion 16 can be split structures, for example, after a circle receiving groove is defined at a center of the substrate 10, the central portion 14 is fixed in the circle receiving groove by means of, for example, adhesion, such that the annular receiving groove 12 is formed between the central portion 14 and the peripheral portion 16, and end surfaces of the central portion 14 and the peripheral portion 16 are flush.

Continuing to refer FIGS. 1-3, each central portion 14 is provided with a plurality of inner via holes 15 running through the substrate 10, the plurality of inner via holes 15 are disposed adjacent to an outer sidewall of the central portion 14, and are arranged along a circumferential direction of the central portion 14. Correspondingly, each peripheral portion 16 is provided with a plurality of outer via holes 17 running through the substrate 10, and the plurality of outer via holes 17 are disposed adjacent to an inner sidewall of the peripheral portion 16. That is, the inner via holes 15 are disposed on a top surface of the central portion 14 and surrounds a top inner circumferential wall of the annular receiving groove 12, and the outer via holes 17 are disposed on a top surface of the peripheral portion 16 and surround a top outer circumferential wall of the annular receiving groove 12.

Each magnetic core 20 is received in one annular receiving groove 12 on the substrate 10 correspondingly, a shape of a section of the magnetic core 20 is approximately identical to a shape of a section of the annular receiving groove 12, so that the magnetic core 20 can be received in the annular receiving groove 12. Wherein, the shape of the section of the magnetic core 29 can be a circle loop, a square loop, an ellipse, etc. Correspondingly, a shape of the annular receiving groove 12 can be a circle loop, a square loop, an ellipse, etc.

In this embodiment, the annular magnet core 20 can be formed by a plurality of annular thin pieces stacked in turn, and can also be formed by coiling narrow and long metal materials, and can also be formed by sintering a mixture of several metals. There can be multiple kinds of methods for forming the annular magnet core 20, and can be flexibly selected according to different materials, the present disclosure is not limited.

The magnetic core 20 can be an iron core, and can also be composed of various magnetic metal oxides, such as manganese-zinc ferrite, nickel-zinc ferrite, etc. Among them, manganese-zinc ferrite has the characteristics of high magnetic permeability, high magnetic flux density and low loss, and nickel-zinc ferrite has the characteristics of extremely high resistivity and low magnetic permeability. The magnetic core 20 in this embodiment is made of manganese-zinc ferrite as a raw material and made by being sintered at a high temperature.

As shown in FIG. 1 and FIG. 2, in this embodiment, two opposite sides of the substrate 10 are respectively provided with a transmission line layer 30. Wherein, the transmission line layer 30 can be made of metal materials. The metal materials for forming the transmission line layer 30 comprise, but are not limited to, copper, aluminum, iron, nickel, gold, silver, platinum group, chromium, magnesium, tungsten, molybdenum, lead, tin, indium, zinc or any alloys thereof, etc.

Furthermore, one of the conductive members 40 is disposed in one of the inner via holes 15 to form an inner conductive hole 18, and one of the conductive members 40 is disposed in one of the outer via holes 17 to form an outer conductive hole 19. The inner conductive hole 18 and the outer conductive hole 19 electrically connect the transmission line layers 30 located at two sides of the substrate 10.

In this embodiment, the conductive members 40 can be metal layers. Specifically, referring to FIG. 2, the conductive members 40 can be formed on inner walls of the inner via holes 15 and of the outer via holes 17 by means of, for example, electroplating, coating, etc., so as to electrically connect the transmission line layers 30 located at two opposite sides of the substrate 10. The materials of the metal layers comprise, but are not limited to, copper, aluminum, iron, nickel, gold, silver, platinum group, chromium, magnesium, tungsten, molybdenum, lead, tin, indium, zinc or any alloys thereof, etc.

In another embodiment, the conductive member 40 can be metal posts, and a diameter of a metal post corresponding to each inner via hole 15 or each outer via hole 17 is less than or equal to a diameter of the inner via hole 15 or the outer via hole 17 where it locates. The materials of the metal posts are the same as the materials of the metal layers of the previous embodiment, and are not repeated here.

Continuing to refer to FIG. 1 and FIG. 2, each transmission line layer 30 includes a plurality of wire patterns 32; wherein, each wire pattern 32 is bridged between an inner conductive hole 18 and an outer conductive hole 19 which correspond to each other, and has one end connected with the conductive member 40 in the inner via hole 15 and another end connected with the conductive member 40 in the outer via hole 17. Therefore, the conductive member 40 in the inner via hole 15 and the conductive member 40 in the outer via hole 17 are sequentially connected with the wire pattern 32 on the transmission line layers 30 located at two opposite sides of the substrate 10, such that a coil circuit capable of surrounding the magnetic core 20 is formed.

Figure 4:
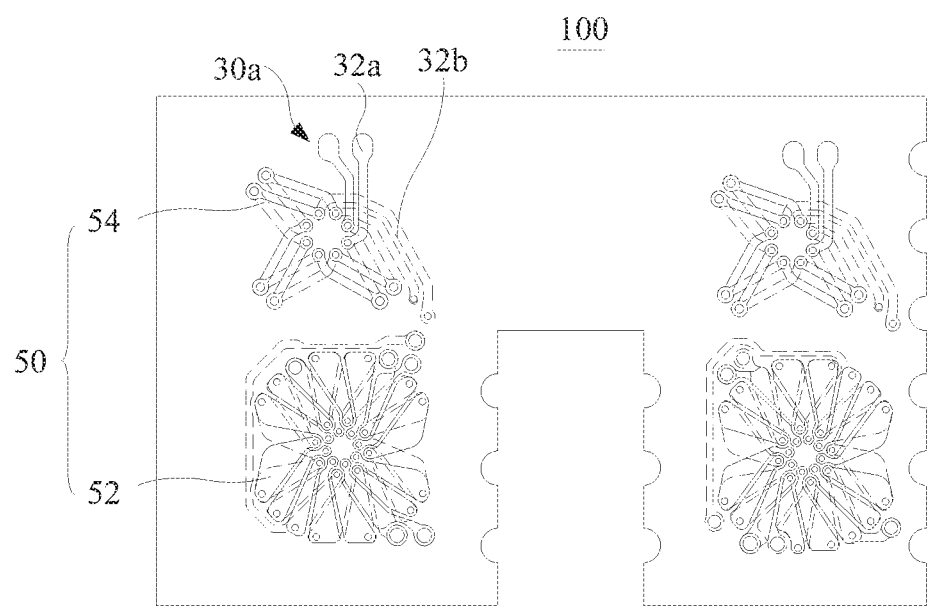
FIG. 4 is a cross-sectional view of a transformer and a filter disposed in the same layer in the electromagnetic device in FIG. 1.

In this embodiment, as shown in FIG. 2 and FIG. 4, the transmission line layers 30 include a first transmission line layer 30a and a second transmission line layer 30b which are respectively located at two opposite sides of the substrate 10. The wire patterns 32 include a first conductive pattern 32a located on the first transmission line layer 30a and a second conductive pattern 32b located on the second transmission layer 30b. The inner conductive hole 18 includes a first inner conductive hole (not shown in the drawings) connected with the first conductive pattern 32a and a second inner conductive hole (not shown in the drawings) connected with the second conductive pattern 32b; the outer conductive hole 19 includes a first outer conductive hole (not shown in the drawings) connected with the first conductive pattern 32a and a second outer conductive hole (not shown in the drawings) connected with the second conductive pattern 32b.

Specifically, the coil circuit includes a plurality circles of coils connected sequentially. In this embodiment, each circle of coil includes a first inner conductive hole, a first conductive pattern 32a, a first outer conductive hole, a second outer conductive hole, a second conductive pattern 32b, and a second inner conductive hole. Wherein, the first outer conductive hole and the second outer conductive hole in each circle of coil share the same outer conductive hole 19 (that is, the outer conductive holes 19 of the plurality of circles of coils coincide). The first inner conductive hole and the second inner conductive hole in each circle of coil are respectively shared by adjacent coils (that is, two adjacent circles of coils coincide with adjacent inner conductive holes 18 respectively). That is, two ends of each inner conductive hole 18 are respectively connected with the wire patterns 32 in adjacent circles of coils, and the two wire patterns 32 are respectively located on the transmission line layers 32 on two sides of the substrate 10.

Alternatively, the outer conductive hole 19 is located on a vertical line of two inner conductive holes 18 of the same circle of coil. Specifically, each circle of coil is connected with an inner conductive hole 18 of a previous adjacent coil, and at the same time, is connected with an inner conductive hole 18 of a next adjacent coil, such that each circle of coil has two inner conductive holes 18 shared with adjacent circles of coils, and the outer conductive hole 19 in each circle of coil is located on a vertical line of the two inner conductive holes 18. Advantages of such an arrangement is that: it is possible to make the outer conductive holes 19 be uniformly distributed on the substrate, so that the distribution is more reasonable, the number of the wire patterns 32 on the transmission line layers 30 is more, thereby improving performance of the electromagnetic device 100.

Wherein, the number of the coil circuits surrounding each magnet core 20 can be one or more. For example, when the number of the coil circuit is one, an inductor component is formed. When the number of the coil circuit is multiple, a transformer or a filter is formed.

Continuing to refer FIG. 1 to FIG. 4, one central portion 14 on the substrate 10, its corresponding peripheral portion 16, one magnet core 20, a plurality of conductive members 40, and wire patterns 32 located on the two transmission line layers 30 and corresponding to each magnetic core 20 can form one transformer 52 or filter 54. Wherein, the transformer 52 differs from the filter 54 in that connection manners of connection terminals of coil circuits are different. In the transformer 52, two terminals of one coil circuits serve as input ends, and two terminals of another coil circuits serve as output ends. In the filter 54, one terminal of any coil circuit serves as an input end, and the other terminal serves as an output end.

The annular receiving grooves 12 on the substrate 10 can be all used to form transformers 52, and can also be all used to form filters 54, and it is also possible that some of them are used to form transformers 52 and others of them are used to form filters 54, this is not limited here. Therefore, the plurality of central portions 14 on the substrate 10, their corresponding peripheral portions 16, the plurality of magnet cores 20, the plurality of conductive members 40, and the transmission line layers 30 located at two opposite sides of the substrate 10 can form a plurality of transformers 52 and/or a plurality of filters 54 arranged according to a predetermined arrangement rule.

In one embodiment, a plurality of transformers 52 and a plurality of filters 54 are simultaneously formed on one substrate 10. That is, the plurality of transformers 52 and the plurality of filters 54 share the same substrate 10. At this time, the transformers 52 and the filters 54 in the electromagnetic device 100 are located in the same layer. One transformer 52 and one filter 54 on the substrate 10 are electrically connected so as to form a group of electromagnetic assembly 50.

In this embodiment, referring to FIG. 4, two groups of electromagnetic assemblies 50 are formed on the substrate 10, each group of electromagnetic assembly 50 includes a transformer 52 and a filter 54. The transformer 52 and the filter 54 in each group of electromagnetic assembly 50 are in electrical connection, while different groups of electromagnetic assemblies 50 are not electrically connected with each other.

In another embodiment, a plurality of transformers 52 or a plurality of filters 54 are simultaneously formed on one substrate 10, that is, there are only transformers 52 or are only filters 54 on the electromagnetic device 100.

In this embodiment, a thickness of the transmission line layer 30 is 17-102 μm (micron). In one embodiment, in order to enhance coupling extent of the transformer 52 so as to dispose more wire patterns 32 on the transmission line layer 30, the thickness of the transmission line layer 30 can be 17-34 μm.

In other embodiments, in order to improve over-current capacity of the transmission line layer 30, the thickness of the transmission line layer 30 can also be 40-100 μm. Alternatively, the thickness of the transmission line layer 30 is 65-80 μm, because when etching the transmission line layer 30 to form the wire patterns 32, if the thickness is too large (i.e., larger than 80 μm) and a distance between two adjacent wire patterns 32 on the same transmission line layer 30 is small, it may be caused that the etching is not clean and connection between two adjacent wire patterns 32 occurs, thereby causing short-circuit; if the thickness is too small (i.e., less than 40 μm), current carrying capability of the wire patterns 32 may be lowered.

In this embodiment, the metal material of the transmission line layer 30 and the material of the conductive members 40 in the inner via holes 15 and the outer via holes 17 can adopt the same material. Taking copper as an example, it is possible to use the substrate 10 as a cathode and place the substrate 10 in salt solution containing copper ions to perform electroplating, so that the transmission line layers 30 are formed on two sides of the substrate 10, and the conductive members 40 are simultaneously formed in inner walls of each inner via hole 15 and each outer via hole 17.

In another embodiment, the material of the transmission line layer 30 and the material of the conductive members 40 in the inner via holes 15 and the outer via holes 17 can also adopt different materials.

Also referring to FIG. 1, in this embodiment, the electromagnetic device 100 includes a first side surface 110 being perpendicular to the transmission line layers 30 and a second side surface 120 being parallel to the transmission line layers 30, and the first side surface 110 is provided with an insertion slot 112. Wherein, the insertion slot 112 runs through the electromagnetic device 100 along an axial direction of the inner via holes 15. A first conductive pin 116 is disposed on at least one of a side wall 114 defining the insertion slot 112 and the side wall 120, and the first conductive pin 116 is electrically connected with at least one transmission line layer 30. Wherein, the first conductive pin 116 is used to connect the electromagnetic device 100 with external circuits, for example, electrically connect with a crystal joint by means of, for example, welding, conductive adhesive bonding, etc.

In this embodiment, the first conductive pin 116 can be only disposed on the side wall 114 defining the insertion hole 112. Specifically, the first conductive pin 116 can be a metal sheet having a first predetermined length, the number of the metal sheet can be one or more. In this embodiment, there are a plurality of metal sheets, and the plurality of metal sheets are disposed to be spaced from each other, each metal sheet is electrically connected with at least one transmission line layer 30.

Wherein, the first predetermined length can be larger than one fifth of a height of the electromagnetic device 100 along the axial direction of the inner via hole 15, while less than or equal to the height of the electromagnetic device 100 along the axial direction of the inner via hole 15. That is, the length of the first conductive pin 116 can be larger than one fifth of the height of the electromagnetic device 100.

In this embodiment, as shown in FIG. 1, the length of the first conductive pin 116 is equal to a height of the substrate 10 along the axial direction of the inner via hole 15. That is, the first conductive pin 116 having the same height as the substrate 10 is disposed on a whole sub-sidewall, so as to make an area of the first conductive pin 116 be the largest, such that welding is more stable when the first conductive pin 116 is welded with an external circuit.

In other embodiments, the first conductive pin 116 can also be in the form of pads, mechanical contacts, and so on, the pads or mechanical contacts are also electrically connected with at least one transmission line layer 30.

Wherein, a shape of the insertion slot 112 can be approximately U-shaped, and can also be semicircle, arc, etc. In this embodiment, referring to FIG. 1, the shape of the insertion slot 112 is U-shaped, that is, the insertion slot has two sub-sidewalls disposed oppositely, and both the two sub-sidewalls are perpendicular to the first side surface 110.

The first conductive pin 116 is disposed on at least one sub-sidewall, for example, the first conductive pin 116 can be disposed on only one of the sub-sidewalls, and can also be disposed on both the two sub-sidewalls. In this embodiment, both the two oppositely disposed sub-sidewalls are provided thereon with a plurality of first conductive pins 116.

Of course, in other embodiments, the two oppositely disposed sub-sidewalls of the insertion slot 112 can also be not perpendicular to the first side surface 110 For example, the shape of the insertion slot 112 can be an irregular quadrilateral, which has two opposite sub-sidewalls, but the two opposite sub-sidewalls are not perpendicular to the first side surface 110.

Furthermore, as shown in FIG. 1, in this embodiment, the insertion slot 112 has an opening, and the opening is disposed at a middle portion of the first surface 110. Of course, in other embodiments, the opening of the insertion slot 112 can also be disposed at portions of the first side surface 110 being dose to a top or a bottom thereof, the present disclosure does not specifically limit here.

In this embodiment, the opening of the insertion slot 112 is disposed at the middle portion of the first side surface 110, a length of a wire for connecting the transformer and/or filter in the electromagnetic device 100 with the first conductive pin 116 in the insertion slot 112 can be reduced, thereby improving electrical performance of the transformer and/or the filter.

The first conductive pin 116 can be directly welded on the sub-sidewall, and it is also possible to adopt other manners to fix the first conductive pin 116 on the sub-sidewall. In this embodiment, as shown in FIG. 1, the two sub-sidewalls are respectively provided thereon with a first arc groove 117 adapted to each first conductive pin 116, and the first conductive pin 116 is disposed in the first arc groove 117.

Specifically, in this embodiment, a plurality of first arc grooves 117 can be first defined in the two sub-sidewalls, and thus the first conductive pins 116 is formed in the first arc grooves 117 by means of, for example, coating or electroplating. Advantages of using the coating or electroplating means is that the shape of the first conductive pin 116 is identical to the shape of the first arc slot 117, that is, the first conductive pin 116 is arc-shaped; the arc-shaped first conductive pin 116, when receiving filled solder to perform welding, can increase a welding area and makes welding be more firm.

Of course, in other embodiments, it is also possible to weld the first conductive pin 116 in the first arc groove 117 by means of such as welding in the first arc groove 117. The present disclosure does not specifically limit the method for forming the first conductive pin 116.

Alternatively, the first conductive pin 116 can be only disposed on the second side surface 120. Wherein, the first conductive pin 116 can be a pad, each pad is electrically connected with at least one transmission line layer 30 of the electromagnetic device 100. Specifically, the first conductive pin 116 extends to a junction between the second side surface 120 and a side wall 114.

Alternatively, the first conductive pin 116 can also be simultaneously disposed on the side wall 114 and the second side surface 120 of the insertion slot 112. Specifically, as shown in FIG. 1, in this embodiment, the first conductive pin 116 includes a conductive main body 119 disposed on the side wall 114 of the insertion slot 112 and a conductive extending portion 118 disposed on the second side surface 120. The conductive extending portion 118 is used to electrically connect with an external circuit, so that a contact area between the conductive main body 119 and the external circuit is further increased, and connection stability is improved.

In this embodiment, as shown in FIG. 1, a plurality of conductive extending portions 118 are disposed on the second side surface 120. Wherein, each conductive extending portion 118 extends to a junction between the second side surface 120 and the side wall 114, and is connected with a corresponding conductive main body 119. The conductive extending portion 118 can be in the form of, for example, pads or mechanical contacts, the present disclosure does not specifically limit here.

Furthermore, the substrate 10 further has a third side surface 130. The third side surface 130 is adjacent to the first side surface 110 and is perpendicular to the transmission line layer 30. The third side surface 130 is provided thereon with a second conductive pin 122, the second conductive pin is electrically connected with at least one transmission line layer 30. Wherein, connection manners for electrically connecting the second conductive pin 122 with at least one transmission line layer 30 comprise: directly connecting the second conductive pin 122 with at least one transmission line layer 30 to implement electrical connection; or indirectly connecting the second conductive pin 122 with at least one transmission line layer 30 through other components to implement electrical connection.

In this embodiment, the first conductive pin 122 is used to connect the electromagnetic device 100 with external circuits, for example, electrically connect with a circuit board by means of, for example, welding, conductive adhesive bonding, etc.

In this embodiment, the second conductive pin 122 can be a metal sheet having a second predetermined length; wherein, the number of the metal sheet can be one or more. In this embodiment, there are a plurality of metal sheets, and the plurality of metal sheets are disposed to be spaced from each other, each metal sheet is electrically connected with at least one transmission line layer 30.

In this embodiment, the second predetermined length of the second conductive pin 122 can be larger than one fifth of a height of the electromagnetic device 100 along the axial direction of the inner via hole 15, while less than or equal to the height of the electromagnetic device 100 along the axial direction of the inner via hole 15. That is, the length of the second conductive pin 122 can be larger than one fifth of the height of the electromagnetic device 100.

In this embodiment, the second predetermined length can be equal to, and can also be not equal to, the first predetermined length, that is, a length range of the second conductive pin 122 can be equal to, and can also be not equal to, a length range of the first conductive pin 116, the present disclosure has no specifically limitation. In this embodiment, the length of the second conductive pin 122 is equal to the length of the first conductive pin 116, and is equal to a height of the electromagnetic device 100 along the axial direction of the inner via hole 15, so as to make an area of the second conductive pin 122 be the largest, such that welding is more stable when the second conductive pin 122 is welded with an external circuit.

In other embodiments, the second conductive pin 122 can also be in the form of pads, mechanical contacts, and so on, the pads or mechanical contacts are also electrically connected with at least one transmission line layer 30.

Furthermore, referring to FIG. 1, in this embodiment, the third side surface 130 is provided with a second arc groove 124 adapted to each second conductive pin 122, and each second conductive pin 122 is disposed in a corresponding second arc groove 124. Wherein, structures and forming methods of the second conductive pin 122 and the second arc groove 124 are identical to structures and forming methods of the first conductive pin 116 and the first arc groove 117, please refer to the structures of the first conductive pin 116 and the first arc groove 117, and are not repeated here.

Figure 7:
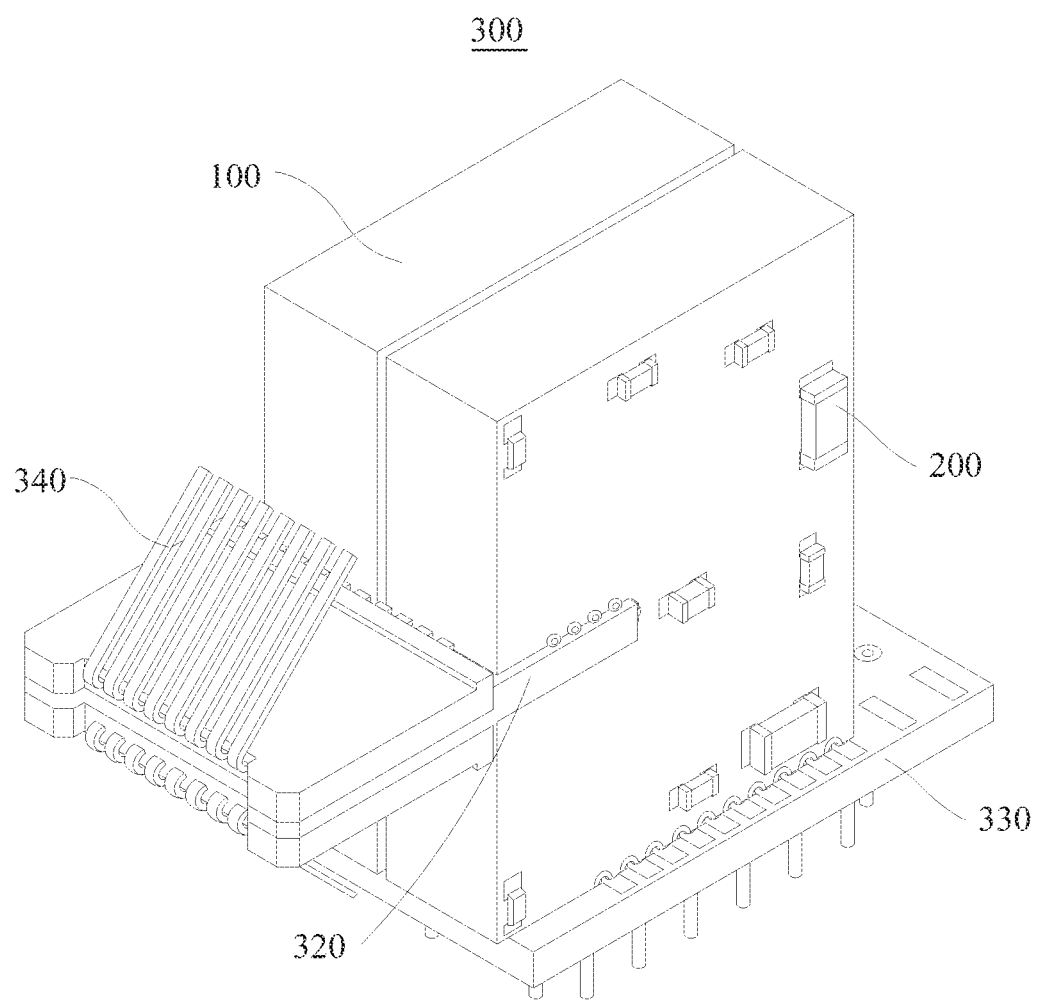
FIG. 7 is a stereoscopic structural schematic view of a connector in another embodiment of the present disclosure.
Figure 8:
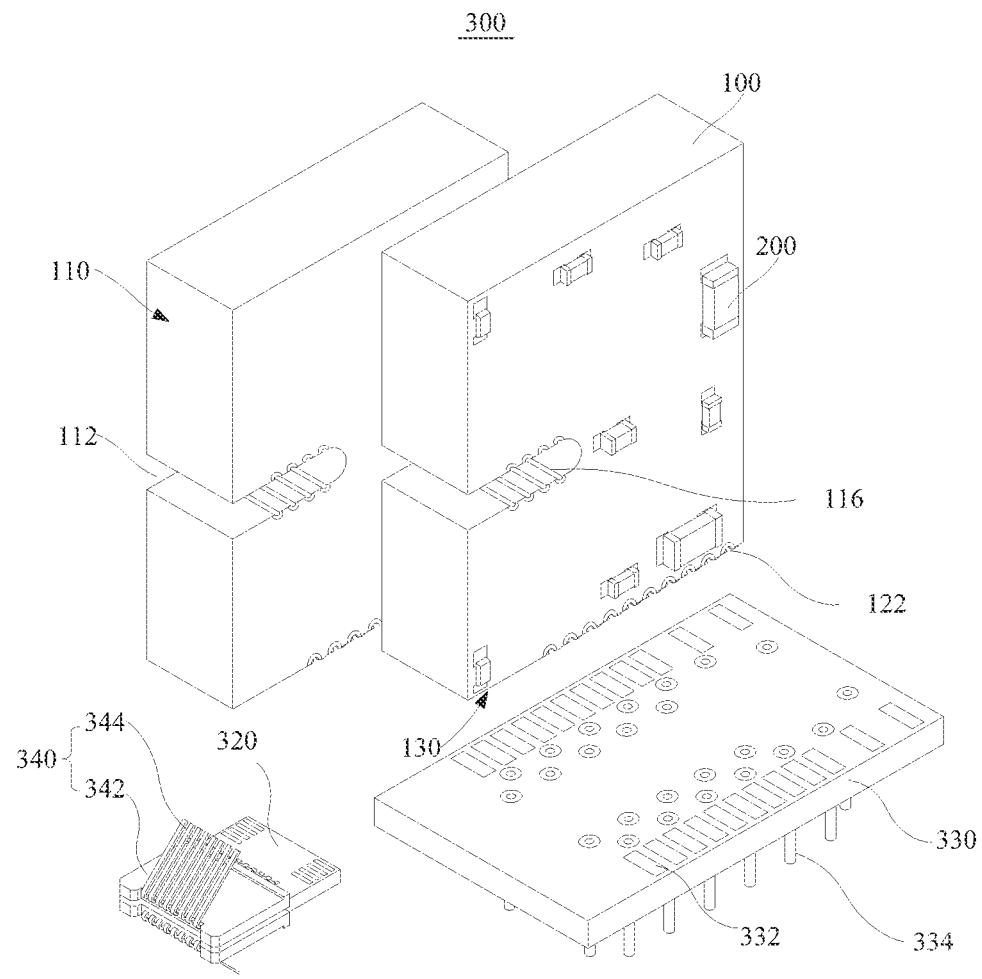
FIG. 8 is a disassembled structural schematic view of the connector in FIG. 7.

The present disclosure further provides a connector 300, as shown in FIG. 7 and FIG. 8, the connector 300 mainly comprises: at least one electromagnetic device 100, a first adapter plate 320 electrically connected with the electromagnetic device 100, and at least one connector assembly 340 electrically connected with the first adapter plate 320. Wherein, the structure of the electromagnetic device 100 is the same as the structure of the electromagnetic device 100 described above, and is not repeated here.

In this embodiment, the connector can be an R145 connector; wherein, the RJ45 connector is a kind of network connector which has the widest application range at present, and is widely applied for data transmission between networks. In other embodiments, the connector can also be an RJ11 connector. RJ11 connectors are usually used for connections between telephones and communication lines or between telephones and microphones. Of course, the connector can also be in other types, and embodiments of the present disclosure has no specific limitation.

In this embodiment, the connector 300 comprises at least two electromagnetic devices 100. For example, at least one transformer and at least one filter can be comprised, the transformer and the filter are combined to process signals flowing into the connector, thereby improving signal processing effect of the connector 300.

In this embodiment, the insertion slot 112 of each electromagnetic device 100 is arranged in alignment, so that it is convenient for one end of the first adapter plate 320 to be simultaneously inserted into the insertion slot 112 of each electromagnetic device 100.

Furthermore, when the first conductive pin 116 and the second conductive pin 122 of two adjacent electromagnetic devices 100 all run through the electromagnetic devices 100, that is, lengths of the first conductive pin 116 and of the second conductive pin 122 are all equal to thicknesses of the electromagnetic devices 100, in order to prevent contacts from forming between the first conductive pin 116 of one electromagnetic device 100 and the corresponding first conductive pin 116 of another electromagnetic device 100 being adjacent thereto, and between the second conductive pin 122 of one electromagnetic device 100 and the corresponding second conductive pin 122 of another electromagnetic device 100 being adjacent thereto, and generating short-circuit, a clearance is usually provided between adjacent electromagnetic devices 100. In one embodiment, a width of a clearance between every two adjacent electromagnetic devices 100 can be set to be larger than or equal to 0.5 mm, wherein the width of the clearance is a width of the least clearance between every two adjacent electromagnetic devices 100. When the width of the least clearance between every two adjacent electromagnetic devices 100 is larger than or equal to 0.5 mm, corresponding first conductive pins 116 which are respectively disposed on the two adjacent electromagnetic devices 100 are insulated from each other, and corresponding second conductive pins 122 which are respectively disposed on the two adjacent electromagnetic devices 100 are insulated from each other.

In another embodiment, an insulating layer 350 can also be disposed between every two adjacent electromagnetic devices 100, the insulating layer 350 is sandwiched between every two adjacent electromagnetic devices 100. The insulating layer 350 makes corresponding first conductive pins 116 which are respectively disposed on the two adjacent electromagnetic devices 100 be insulated from each other, and corresponding second conductive pins 122 which are respectively disposed on the two adjacent electromagnetic devices 100 be insulated from each other.

Wherein, the insulating layer 350 can be insulating resin, green oil, polymer resin, insulating glue, etc., and the insulating layer 350 can be fixed between two adjacent electromagnetic devices 100 by means of hot pressing, coating, etc.

Figure 9:
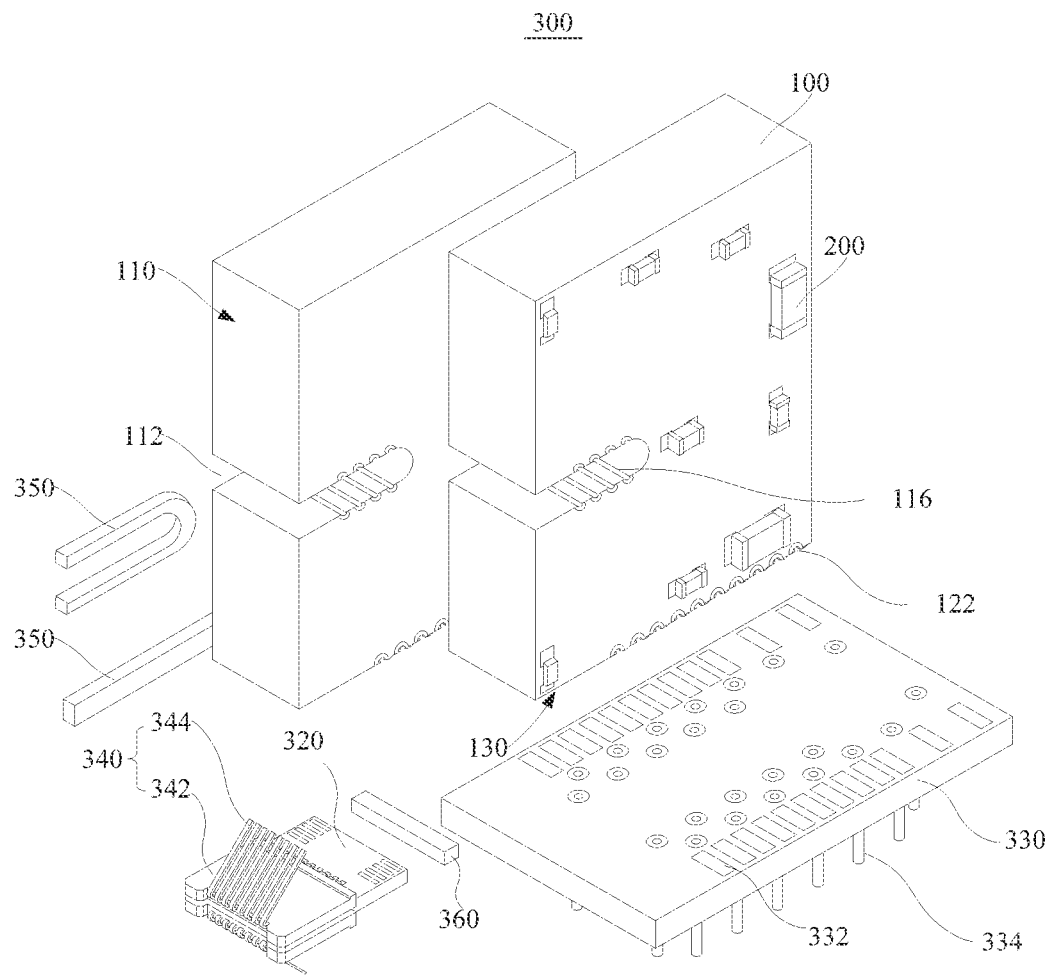
FIG. 9 is a disassembled structural schematic view of a connector in another embodiment of the present disclosure.

Furthermore, in this embodiment, as shown in FIG. 9, the insulating layer can be only disposed at positions in the electromagnetic device 100 where the first conductive pin 116 and the second conductive pin 122 are disposed, so that the first conductive pin 116 of one electromagnetic device 100 and the corresponding first conductive pin 116 of another electromagnetic device 100 being adjacent thereto are insulated from each other, and the second conductive pin 122 of one electromagnetic device 100 and the corresponding second conductive pin 122 of another electromagnetic device 100 being adjacent thereto are insulated from each other. By disposing the local insulating layer 350, effect of reducing used amount of the insulating layer 350 and thus reducing production cost can be provided.

In another embodiment, when adjacent electromagnetic devices 100 are connected tightly, that is, a width of the least clearance between adjacent electromagnetic devices 100 is zero, a back drilling treatment can be performed at mutually close ends of the first conductive pin 116 and of the second conductive pin 122 of at least one of the electromagnetic devices 100, such that lengths of the first conductive pin 116 and the second conductive pin 122 subjected to the back drilling treatment are less than a thickness of the electromagnetic device 100. Wherein, a depth of the back drilling treatment is larger than or equal to 0.05 mm, that is, after performing the back drilling treatment, a distance between the first conductive pin 116 of one electromagnetic device 100 and the corresponding first conductive pin 116 of another electromagnetic device 100 being adjacent thereto along a stack direction is larger than or equal to 0.05 mm, and a distance between the second conductive pin 122 of one electromagnetic device 100 and the corresponding second conductive pin 122 of another electromagnetic device 100 being adjacent thereto along a stack direction is larger than or equal to 0.05 mm. Wherein, the distance between the first conductive pin 116 of one electromagnetic device 100 and the corresponding first conductive pin 116 of another electromagnetic device 100 being adjacent thereto along a stack direction refers to the least distance between a distance between the first conductive pin 116 of one electromagnetic device 100 and the corresponding first conductive pin 116 of another electromagnetic device 100 being adjacent thereto along a stack direction.

By the above three disposing manners, the first conductive pin 116 and the second conductive pin 122 of one electromagnetic device 100 can be respectively enabled to mutually insulate from the corresponding first conductive pin 116 and second conductive pin 122 of another electromagnetic device 100 being adjacent thereto. Of course, it is also possible to adopt other manners to achieve the purpose that the first conductive pin 116 and the second conductive pin 122 of one electromagnetic device 100 respectively mutually insulate from the corresponding first conductive pin 116 and second conductive pin 122 of another electromagnetic device 100 being adjacent thereto. The preset disclosure has no limitation here.

As shown in FIG. 7 and FIG. 8, in this embodiment, specifically, one end of the first adapter plate 320 is simultaneously inserted in the insertion slots 112, and is respectively electrically connected with the electromagnetic devices 100. Another end of the first adapter plate 320 extends out of the insertion slots 112, and is respectively fixed to and electrically connected with the connector assemblies 340. Thus, electrical connection between each electromagnetic device 100 and a corresponding connector assembly 340 can be implemented through the first adapter plate 320.

When an electromagnetic device 100 in the connector 300 includes both a transformer and a filter, a first end of the transformer is electrically connected with the first conductive pin 116 in the insertion slot 112, and a second end of the transformer is electrically connected with a first end of the filter; a second end of the filter is electrically connected with a second connection terminal 121.

Figure 10:
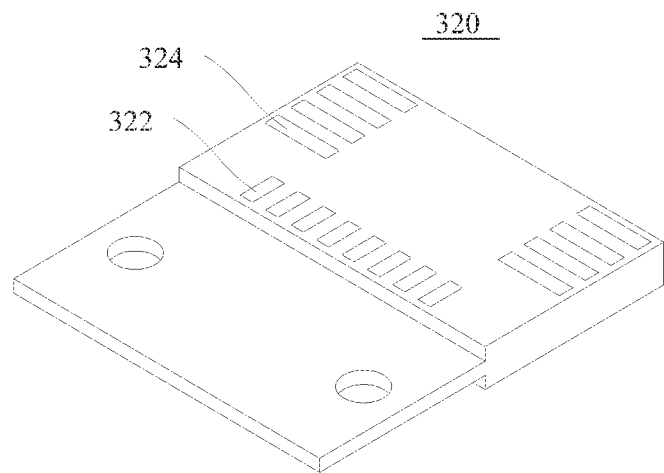
FIG. 10 is a stereoscopic structural schematic view of a first adapter plate in FIG. 8.

In this embodiment, the connector assembly 340 is detachably connected with the first adapter plate 320. FIG. 10 specifically shows a structure of the first adapter plate 340. In combination with FIGS. 8-10, in this embodiment, a surface of the end of the first adapter 320 extending out of the insertion slot 112, which is in contact with each connector assembly 340, is provided with a first pad 322, and each connector assembly 340 is welded with a corresponding first pad 322 located at the same side of the first adapter plate 320, thereby implementing electrical connection between the first adapter plate 320 and each connector assembly 340.

In further combination with FIG. 8 and FIG. 10, the end of the first adapter plate 320 inserted in the insertion slot 112 is provided thereon with a second pad 324, and each second pad 324 is electrically connected with a corresponding first pad 322. Wherein, the second pad 324 can be disposed on one surface of the first adapter plate 320, or both two opposite surfaces are provided thereon with the second pads 324. The second pad 324 is welded with a corresponding first conductive pin 116 located on the side wall 114 of the insertion slot 112, thereby implementing electrical connection between the electromagnetic device 100 and the first adapter plate 320.

In above, the first pad 322 is electrically connected with a corresponding second pad 324, the second pad 324 is electrically connected with a corresponding first conductive pin 116, thereby implementing electrically connection between each first pad 322 and a corresponding first conductive pin 116.

Wherein, the numbers of the first pad 322 and of the second pad 324 can be only one or more, the present disclosure has no limitation here. In this embodiment, a plurality of first pads 322 and a plurality of second pads 324 are disposed, thereby making connections be more stable.

Wherein, a length of the first adapter plate 320 along a stack direction of the electromagnetic device 100 can be equal to a thickness of a stacked electromagnetic device 100. At this time, each first conductive pin 116 on the first adapter plate 320 is correspondingly welded with one of the second pads 324 to implement electrical connection.

In another embodiment, the length of the first adapter plate 320 along a stack direction of the electromagnetic device 100 can also be larger than the thickness of a stacked electromagnetic device 100. Specifically, the first adapter plate 320 has one part accommodated in the insertion slot 112 and another part exposed out of the insertion slot 112. The second pad 324 is disposed on the part exposed out of the insertion slot 112. At this time, the first conductive pin 116 of the electromagnetic device 100 is only disposed on the second side surface 120, and the second pad 324 located out of the insertion slot 112 can be connected with a corresponding first conductive pin 116 by means of solder paste or the like, thereby implementing electrical connection.

In another embodiment, the length of the first adapter plate 320 along a stack direction of the electromagnetic device 100 can also be larger than the thickness of a stacked electromagnetic device 100. Specifically, each second pad 324 on the first adapter plate 320 has one part accommodated in the insertion slot 112 and another part exposed out of the insertion slot 112. At this time, the first conductive pin 116 of the electromagnetic device 100 includes the conductive main body 119 and the conductive extending portion 118. Wherein, the part of the second pad 324 in the insertion slot 112 is welded with a corresponding conductive main body 119 for electrical connection; the part of the second pad 324 located out of the insertion slot 112 can be connected with a corresponding conductive extending portion 118 by means of solder paste or the like, thereby implementing electrical connection. The advantage of such arrangements is that: a part of the first adapter plate 320 located in the insertion slot 112 is welded with the electromagnetic device 100 in a direction being perpendicular to the transmission line layer 30, and a part of the first adapter plate 320 located out of the insertion slot 112 is welded with the electromagnetic device 100 in a direction being parallel to the transmission line layer 30, so that welding in two directions being perpendicular to each other is implemented, and the connection stability is further improved.

Furthermore, in this embodiment, the connector 300 further comprises a connection layer 360 sandwiched between the first adapter plate 320 and the side wall 114 of the insertion slot 112, the connection layer 360 is used to fixedly connect the first adapter plate 320 and the electromagnetic device 100.

Wherein, in one embodiment, the connection layer 360 can be disposed between the first adapter plate 320 and the two sub-sidewalls, and the connection layer 360 does not interfere with the second pad 324 disposed on the first adapter plate 320.

In this embodiment, as shown in FIG. 9, the connection layer 360 is disposed between a side surface of the first adapter plate 320 which is inserted in the insertion slot 112 and is provided with no second pad 324 and the side wall 114 of the insertion slot 112. At this time, the connection layer 360 is not located at the same side surface as the second pad 324, and thus can avoid from interfering with the second pad 324.

In this embodiment, the surface of the first adapter plate 320 being provided with the second pad 324 is perpendicular to the transmission line layer of the electromagnetic device 100, that is, the first adapter plate 320 is perpendicular to the transmission line layer of the electromagnetic device 100.

FIGS. 7-8 further specifically shows a structure of the connector assembly 340. As show in FIGS. 7-8, in this embodiment, each connector assembly 340 includes a casing 342 and a first conductive joint 344. Wherein, the connector assembly 340 implements electrical connection with the first adapter plate 320 through the first conductive joint 344. The number of the first conductive joint 344 can be one or more, the present disclosure has no limitation here. In this embodiment, a plurality of first conductive joints 344 are provided, so that connection between the connector assembly 340 and the first adapter plate 320 is more stable.

Figure 11:
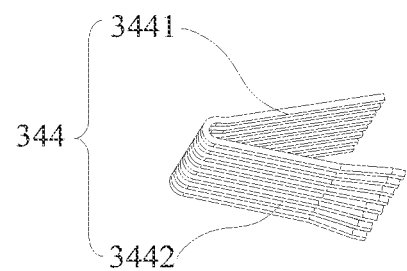
FIG. 11 is a stereoscopic structural schematic view of a first conductive connecting joint in FIG. 8.

FIG. 11 specifically shows a structure of the first conductive joint 344. In this embodiment, a plurality of first conductive joints 344 are arranged side by side, each first conductive joint 344 can include a first conductive connecting portion 3441 and a second conductive connecting portion 3442. The second conductive connecting portion 3442 is disposed in the casing 342, and the first conductive connecting portion 3441 extends out of the casing. Wherein, the second conductive connecting portion 3442 has one end connected with the first conductive connecting portion 3441, and another end electrically connected with the first adapter plate 320. There is an included angle between the first conductive connecting portion 3441 and the second conductive connecting portion 3442, and the included angle is less than 90°.

Specifically, in this embodiment, each second conductive connecting portion 3442 in each connector assembly 340 is parallel to the first adapter plate 320, and each second conductive connecting portion 3442 is further welded with a corresponding first pad 322 located at the same side of the first adapter plate 320, thereby implementing electrical connection between the connector assembly 340 and the first adapter plate 320.

In another embodiment, the connector assembly 340 and the first adapter plate 320 can also be an integrated structure. Specifically, the casing 342 of the connector assembly 340 and the first adapter plate 320 can be integrally injection molded by means of injection molding. The advantage of such an arrangement manner is that: welding between the connector assembly 340 and the first adapter plate 320 can be reduced, so that assembly is more convenient, and connection is more stable.

In this embodiment, referring to FIG. 7 and FIG. 8, the connector 300 can comprises two connector assemblies 340 and two electromagnetic devices 100. Wherein, the two electromagnetic devices 100 are arranged to be stacked along an axial direction of the inner via hole. The two connector assemblies 340 sandwich the end of the first adapter plate 320 extending out of the insertion slot 112, and are respectively fixed to and electrically connected with the first adapter plate 320, so that the two connector assemblies 340 can be connected with the two electromagnetic devices 100 through the first adapter 320. In this embodiment, continuing to refer to FIGS. 7-8, the second conductive connecting portions 3442 in the two connector assemblies 340 are parallel to each other, and the first conductive connecting portions 3441 in the two connector assemblies 340 are arranged as mirror-images.

In this embodiment, by disposing the connector assemblies 340 at two sides of the first adapter plate 320 respectively, it is possible to make the number of signal channels of the electromagnetic device 100 be increased, so that signal processing efficiency is improved in the case that an area of space occupied by the electromagnetic device 100 is unchanged.

Of course, in other embodiments, the connector 300 can also comprise only one connector assembly 340 and two electromagnetic devices 100. Wherein, the two electromagnetic devices 100 are arranged to be stacked along an axial direction of the inner via hole. Wherein, the connector assembly 340 can be fixed on any surface of the first adapter plate 320. Specifically, any surface of the end of the first adapter plate 320 extending out of the insertion slot 112 can be provided thereon with a plurality of aforesaid first pads 322, and each second conductive connecting portion 3442 in the connector assembly 340 is welded with a corresponding first pad 322, so that the connector assembly 340 can be electrically connected with the first adapter plate 320.

In this embodiment, the connector 300 further comprises a second adapter plate 330, a side of the second adapter plate 330 is fixed to and electrically connected with the electromagnetic device 100. Specifically, referring to FIG. 7 and FIG. 8, in this embodiment, a side of the second adapter plate 330 is provided with a third pad 332, and the third pad 332 is correspondingly welded with the second conductive pin 122 of the electromagnetic device 100, so that the second adapter plate 330 is welded on the third side surface 130 of the electromagnetic device 100.

Wherein, the number of the third pad 32 can be one or more, the present disclosure does not make any specific limitation here. In this embodiment, a plurality of third pads 332 and a plurality of second conductive pins 122 are provided, so as to make connection between the electromagnetic device 100 and the second adapter plate 330 be more stable.

In this embodiment, a surface of the second adapter plate 330 being provided with the third pad 332 is parallel to an axis of a magnetic core (not shown), that is, the second adapter plate 330 is parallel to the axis of the magnetic core. Since the axis of the magnetic core is perpendicular to the transmission line layer, the surface of the second adapter plate 330 being provided with the third pad 332 is perpendicular to the transmission line layer of the electromagnetic device 100; that is, the second adapter plate 330 is perpendicular to the transmission line layer of the electromagnetic device 100.

Additionally, as described above, since the first adapter plate 320 is perpendicular to the transmission line layer of the electromagnetic device 100, and the second adapter plate 330 is perpendicular to the transmission line layer of the electromagnetic device 100, the first adapter plate 320 is parallel to the second adapter plate 330. Furthermore, since the second conductive connecting portion 3442 of each connector assembly 340 is parallel to the first adapter plate 320, the second conductive connecting portion 3442 of each connector assembly 340 is then parallel to the second adapter plate 330.

Further referring to FIGS. 7-8, a side of the second adapter plate 330 being away from the electromagnetic device 100 is further provided with conducive needles 334, and the conductive needles 334 are electrically connected with corresponding third pads 332. That is, a surface of the second adapter plate 330 being away from the third pad 332 is provided thereon with the conductive needles 334 electrically connected with the corresponding third pads 332. The conductive needles 334 are spacedly disposed on the second adapter plate 330, are perpendicular to the second adapter plate 330, and are used to connect the connector 300 with external circuits.

Wherein, the number of the conductive needles 334 can be one or more, and the present disclosure does not make any specific limitation here. In this embodiment, a plurality of conductive needles 334 and a plurality of third pads 332 are provided, so that connections between the connector 300 and external circuits are more stable.

Figure 5:
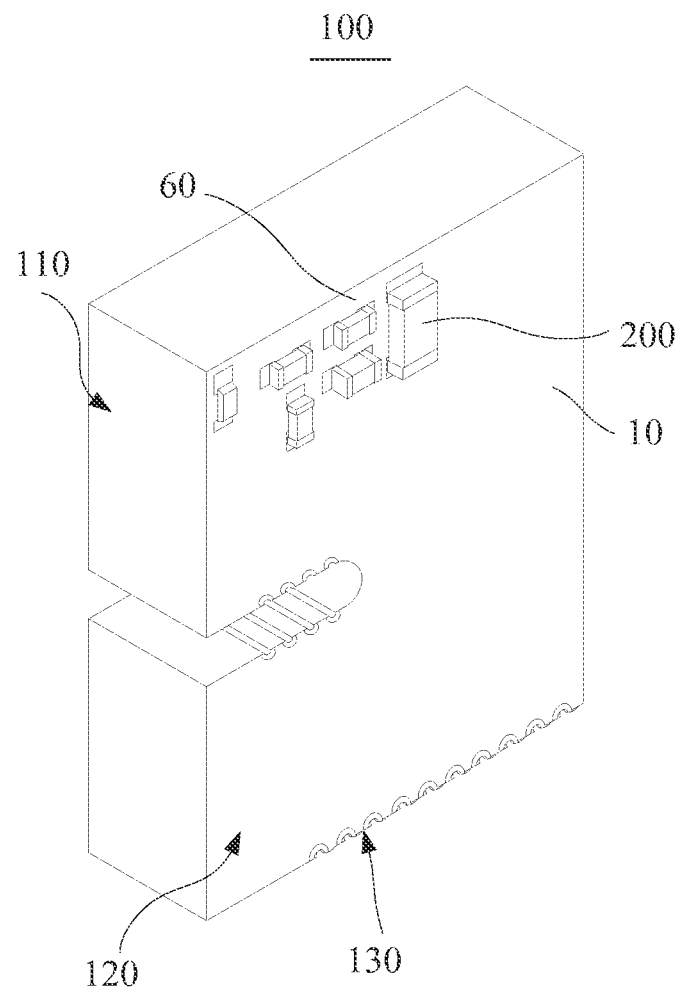
FIG. 5 is a structural schematic view of the electromagnetic device provided with a joint layer in FIG. 1.

Further referring to FIG. 5 and FIG. 7, in this embodiment, at least one side of the connector 300 having the transmission line layer (not shown in these figures) is further provided with a joint layer 60 configured to fix and electrically connect an electronic component 200. Specifically, the joint layer 60 is directly disposed on the at least one side of the connector 300 having the transmission line layer, and the electronic component 300 is directly connected to the joint layer 60. Wherein, "directly connected" herein refers to that the electronic component 200 is connected to the joint layer 60 without the help of other intermediate medium. Actually, the electronic component 200 comprises leading-out terminals (not shown in these figures), and the leading-out terminals is directly connected to the joint layer 60.

For example, in the embodiment shown in FIG. 5, the connector 300 has the transmission line layer and the joint layer 60 disposed in the same layer, wherein, the electronic component 200 is directly connected on the joint layer 60. The joint layer 60 is located in the same layer as, not overlapped with, and electrically connected with the transmission line layer at a side thereof. Wherein, "not overlapped with" refers to that a projection area of the joint layer 60 on the substrate 10 is not overlapped with a projection area of the transmission line layer at the same side on the substrate 10, and the joint layer 60 can also be electrically connected with the transmission line layer located in the same layer through, for example, conductive connecting wires.

In other embodiments, the joint layer 60 can also be electrically connected with a transmission line layer on another side of the connector 300. For example, it is possible to define conductive holes in the joint layer 60, and implement electrical connection with a transmission line layer at a side of the connector 300 being away from the joint layer 60 through the conductive holes, this not limited here.

Figure 6:
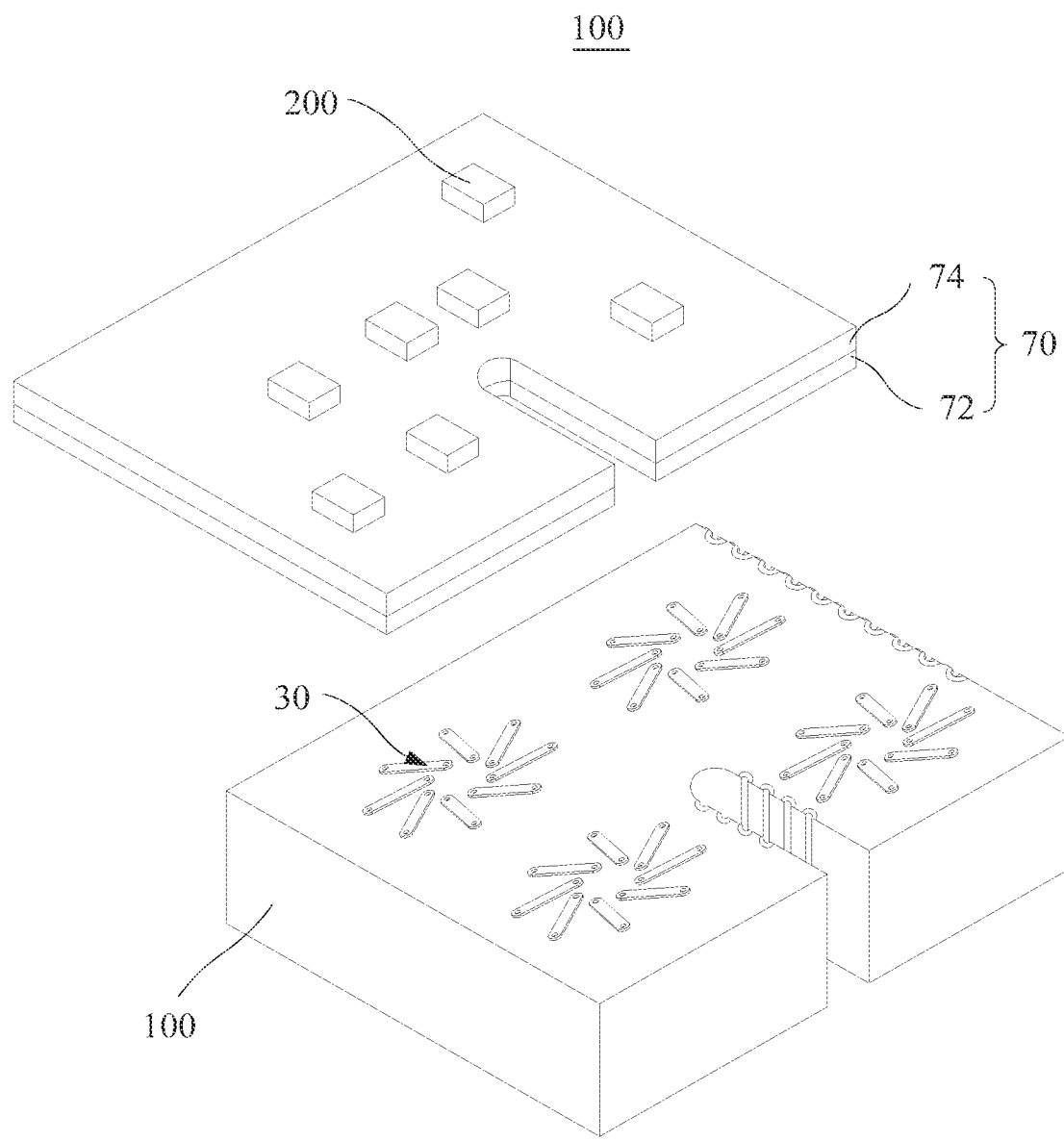
FIG. 6 is a structural schematic view of the electromagnetic device provided with a composite layer in FIG. 1.

In another embodiment, as shown in FIG. 6 and FIG. 7, the connector 300 further comprises a composite layer 70, wherein the composite layer 70 is disposed on at least one side of the connector 300 having the transmission line layer 30. The composite layer 70 is used to dispose the electronic component 200, so that the electronic component 200 is electrically connected with at least one transmission line layer 30 being adjacent to the composite layer 70.

In this embodiment, the composite layer 70 includes a connection layer 72 and a conductive layer 74, wherein, the connection layer 72 is located between the conductive layer 74 and a corresponding transmission line layer 30, and is used to fix the conductive layer 74 on the transmission line layer 30 of the connection 300 and separate the conductive layer 74 from the transmission line layer 30 to prevent short-circuit. The electronic component 200 is disposed on the conductive layer 74.

Furthermore, in other embodiments, the connector 300 can further comprise the electronic component 200, and the electronic component 200 is disposed on the joint layer 60 as shown in FIG. 5 or the composite layer 70 as shown in FIG. 6.

In one embodiment, the conductive layer 74 of the composite layer 70 is a pad layer, and the electronic component 200 is attached or welded on the conductive layer 74.

The number of the electronic component 200 disposed on the joint layer 60 or the conductive layer 74 is one or more, and the electronic component 200 can include, but is not limited to, resistors, capacitors, inductors, etc. Moreover, a plurality of electronic components 200 can also be connected with each other to form a circuit having a certain function, such as a filtering circuit. When a plurality of electronic components 200 are connected to form a filtering circuit, interfering signals in signals after being processed by the electromagnetic device 100 can be filtered, thereby improving performance of the connector 300.

The present disclosure further provides an electronic device, the electronic device comprises at least one connector and a mother board. Wherein, the mother board is provided with an external circuit, and each connector is electrically connected with the external circuit on the mother board. Wherein, the specific structure of the connector can refer to the structure of the connector 300 in the above embodiments, and is not repeated here.

In conclusion, in the present disclosure, the first side surface 110 of the electromagnetic device 100 being perpendicular to the transmission line layers 30 is provided with the insertion slot 112, which is used to fix and connect the first adapter plate 320. The first conductive pin 116 electrically connected with at least one transmission line layer 30 is disposed in the insertion slot 112 or on the second side surface 120 being parallel to the transmission line layer 30, by the electrical connection between the first conductive pin 116 and the first adapter plate 320, the electrical connection between the first conductive pin 116 and the first adapter plate 320 is implemented. Another end of the first adapter plate 320 extends out of the insertion slot 112, and is fixed to and electrically connected with the connector assembly 340. Since the connector assembly 340 is fixedly in the insertion slot 112 through the first adapter plate 320, the insertion slot 112 makes both two sides of the first adapter plate 320 be subjected to uniform forces, so that the connection between the connector assembly 340 and the electromagnetic device 100 is more stable.

The above are merely embodiments of the present disclosure and are not intended to limit the patent scope of the present disclosure. Any equivalent structure or equivalent process transformation made with content of the specification and drawings of the present disclosure, or direct or indirect use in other relating technical fields, are all similarly included in the patent protection scope of the present disclosure.

What is claimed is:

1. An electromagnetic device, comprising:
   a substrate defining a plurality of annular receiving grooves, wherein each annular receiving groove divides the substrate into a central portion surrounded by the annular receiving groove and a peripheral portion surrounding the annular receiving groove, each central portion defines a plurality of inner via holes running through the substrate, and each peripheral portion defines a plurality of outer via holes running through the substrate;
   a plurality of magnetic cores each received in the plurality of annular receiving grooves;
   at least two transmission line layers, wherein each of two opposite sides of the substrate is provided with one of the transmission line layers, each transmission line layer comprises a plurality of wire patterns arranged spacedly, and each wire pattern is bridged between one of the inner via holes and one of the outer via holes corresponding to each other; and
   a plurality of conductive members, which are respectively disposed in each of the inner via holes and each of the outer via holes, and are configured to sequentially connect the wire patterns on the two transmission line layers so as to form a coil circuit capable of surrounding the magnet cores;
   wherein, the plurality of central portions on the substrate, the peripheral portions corresponding thereto, the plurality of magnet cores, the plurality of conductive members, and the transmission line layers located at the two opposite sides of the substrate form a plurality of transformers and/or a plurality of filters;
   wherein, the electromagnetic device further comprises a first side surface being perpendicular to the transmission line layers, the first side surface is provided with an insertion slot, the insertion slot runs through the electromagnetic device along an axial direction of one of the inner via holes, and the insertion slot is configured to fix and connect a first adapter plate.

2. The electromagnetic device according to claim 1, wherein, the electromagnetic device further comprises a second side surface and a first conductive pin, the second side surface is parallel to the transmission line layers;
   the first conductive pin is disposed on at least one of a side wall of the electromagnetic device surrounding the insertion slot and the second side surface, and the first conductive pin is electrically connected with at least one of the transmission line layers.

3. The electromagnetic device according to claim 2, wherein, the first conductive pin is disposed on the second surface or disposed on both the side wall and the second surface, and extends to a junction between the second side surface and the side wall.

4. A connector, comprising a first adapter plate, at least one connector assembly, and at least one electromagnetic device according to claim 1;
   wherein, one end of the first adapter plate is inserted in the insertion slot of the at least one electromagnetic device, and is electrically connected with the at least one electromagnetic device: another end of the first adapter plate extends out of the insertion slot and is fixed to and connected with the at least one connector assembly;
   the at least one electromagnetic device is electrically connected with the at least one connector assembly through the first adapter plate.

5. The connector according to claim 4, wherein, the first adapter plate and the connector assembly are an integrated structure.

6. The connector according to claim 4, wherein, the insertion slot is provided therein with a connection layer, and the connection layer is sandwiched between the first adapter plate and the side wall of the insertion slot.

7. The connector according to claim 4, wherein, the connector assembly comprises a casing and a first conductive joint; the first conductive joint includes a first conductive connecting portion and a second conductive connecting portion, the second conductive connecting portion is disposed in the casing, and the second conductive connecting portion has one end electrically connected with the first adapter plate and another end electrically connected with the first conductive connecting portion: the first conductive connecting portion extends out of the casing, and an included angle between the first conductive connecting portion and the second conductive connecting portion is less than 90°.

8. The connector according to claim 7, wherein, the connector comprises at least two electromagnetic devices, the at least two electromagnetic devices are arranged to be stacked along an axial direction of the inner via hole, and the insertion slots of the at least two electromagnetic devices are aligned with each other.

9. The connector according to claim 8, wherein, the connector comprises at least two connector assemblies; one end of the first adapter plate is inserted in the at least two insertion slots, an end of the first adapter plate extending out of the insertion slot is sandwiched between the two connection assemblies, and the two connector assemblies are respectively fixed to and electrically connected with the first adapter plate.

10. The connector according to claim 9, wherein, both two opposite surfaces of the first adapter plate being in contact with each connector assembly are provided with a first pad and a second pad, the first pad is electrically connected with the second pad; wherein, the first pad is located out of the insertion slot, and the second pad is located in the insertion slot; the first pad is welded with a corresponding second conductive connecting portion, and the second pad is welded with a corresponding first conductive pin, so that the second conductive connecting portion is electrically connected with a corresponding first conductive pin.

11. The connector according to claim 8, wherein, the connector further comprises a second adapter plate, the at least two electromagnetic devices are fixed on the second adapter plate, and are electrically connected with the second adapter plate.

12. The connector according to claim 11, wherein, the second conductive connecting portion of each connector assembly is parallel to the second adapter plate.

13. The connector according to claim 11, wherein, the electromagnetic device further comprises a third side surface being perpendicular to the transmission line layer, the third side surface is disposed adjacently to the first side surface; the third side surface is provided thereon with a second conductive pin, and the second conductive pin is electrically connected with at least one transmission line layer; the second adapter plate is provided with a third pad, the third pad is welded with the second conductive pin, so that the electromagnetic device is fixed on the second adapter plate.

14. The connector according to claim 13, wherein, both the first conductive pin and the second conductive pin run through the electromagnetic device, and a clearance is provided between every two adjacent electromagnetic devices, so that two corresponding first conductive pins or two corresponding second conductive pins on the two adjacent electromagnetic devices are insulated from each other.

15. The connector according to claim 13, wherein, the connector further comprises an insulating layer, the insulating layer is sandwiched between every two adjacent electromagnetic devices.

16. The connector according to claim 13, wherein, a sum of lengths of the first conductive pin and the second conductive pin of adjacent electromagnetic devices is less than a thickness of the electromagnetic device.

17. The connector according to claim 13, wherein, a surface of the second adapter plate being away from the third pad is provided with a conductive needle, the conductive needle is electrically connected with the third pad, and the conductive needle is configured to electrically connect the connector with an external circuit.

18. The connector according to claim 4, wherein, at least one side of the connector having the transmission line layer is provided with a joint layer configured to fix and electrically connect an electronic device; the joint layer is located in the same layer as, not overlapped with, and electrically connected with the transmission line layer at the side.

19. The connector according to claim 4, further comprising:
a composite layer disposed on at least one side of the connector having the transmission line layer, and configured to dispose the electronic component so that the electronic component is electrically connected with at least one transmission line layer; the composite layer includes a connection layer and a conductive layer, the connection layer is located between the conductive layer and a corresponding transmission line layer, and the electronic component is attached on the conductive layer.

20. An electronic device, comprising a mother board and at least one connector according to claim 4; wherein the mother board is provided with an external circuit, and the external circuit is electrically connected with the at least one connector.

* * * * *